United States Patent [19]

Gay et al.

[11] Patent Number: 5,493,438
[45] Date of Patent: Feb. 20, 1996

[54] AMPLITUDE OPTICAL MODULATOR USING A TWO-ELECTRODE DFB LASER STRUCTURE

[75] Inventors: Emmanuel Gay; Mouhamad Chawki, both of Lannion; Marc Le Ligne, Pleumeur-Bodou, all of France

[73] Assignee: France Telecom Etablissement Autonome de Droit Public, Paris, France

[21] Appl. No.: 210,942

[22] Filed: Mar. 21, 1994

[30] Foreign Application Priority Data

Mar. 29, 1993 [FR] France .................................... 93 03591

[51] Int. Cl.⁶ ..................................................... G02F 1/03
[52] U.S. Cl. ........................ 359/246; 359/245; 359/248; 359/254; 359/276; 372/26; 372/31; 372/96
[58] Field of Search .................................. 359/248, 254, 359/276, 245, 246; 372/26, 31, 96, 27, 28

[56] References Cited

U.S. PATENT DOCUMENTS 4,835,779  5/1989  Liou ............................................ 372/26

OTHER PUBLICATIONS

Journal of Lightwave Techology, vol. 10, No. 10, pp. 1388–1397, Oct. 1992, M. J. Chawki, et al., "Two–Electrode DFB Laser Filter Used as a Wide Tunable Narrow–Band FM Receiver: Tuning Analysis, Characteristics and Experimental FSK–WDM System".

The Transactions of the IEICE, vol. E71, No. 10, pp. 972–974, Oct. 1988, M. Fujiwara, et al., "1.55 μm Laser Diode Optical Modulator".

IBM Technical Disclosure Bulletin, vol. 36, No. 02, pp. 43–45, Feb. 1993, "Self–Tuning Optical External Modulator".

Primary Examiner—Scott J. Sugarman
Assistant Examiner—Dawn-Marie Bey
Attorney, Agent, or Firm—Oblon, Spivak, McClelland, Maier & Neustadt

[57] ABSTRACT

An amplitude optical modulator which utilizes a two-electrode DFB laser structure. The amplitude optical modulator includes a current generator which can modulate at least one of two currents injected into the DFB laser structure. This modulation displaces a spontaneous emission peak of the DFB laser structure, which leads to an amplitude modulation of the injected optical beam. Such an amplitude optical modulator may find particular application in an optical telecommunications system.

6 Claims, 5 Drawing Sheets

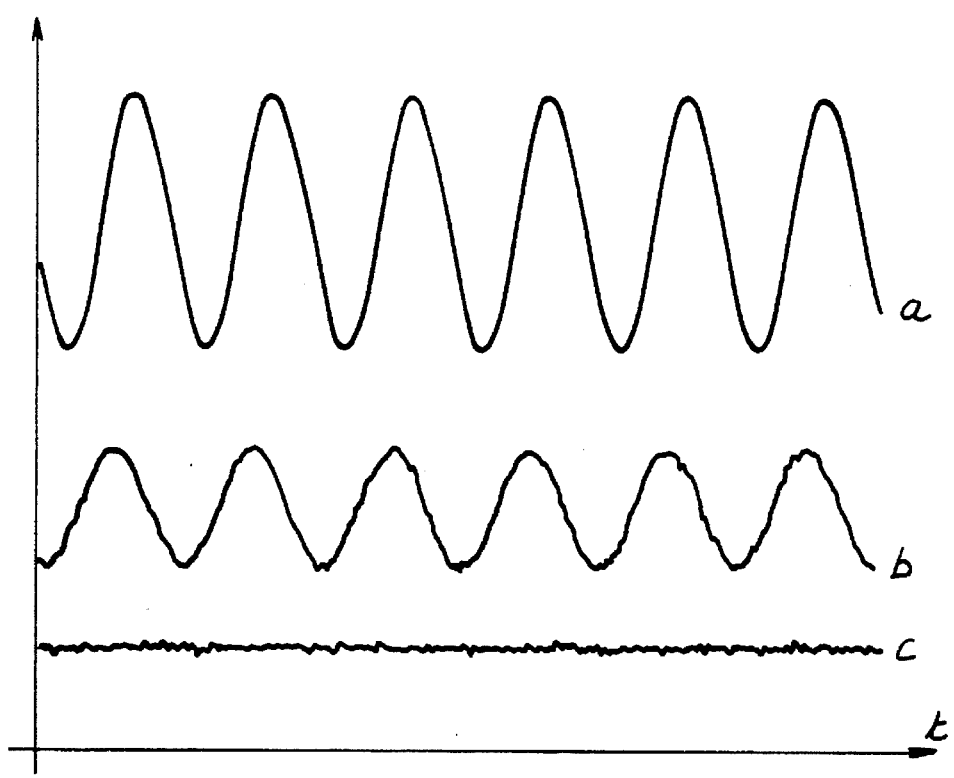
FIG. 9
FIG. 10
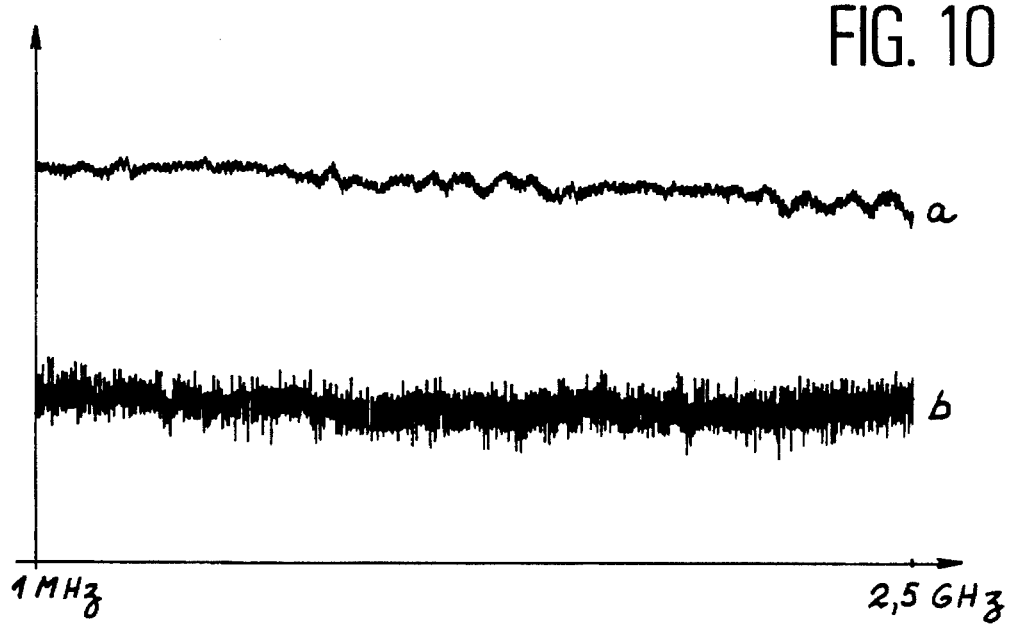

AMPLITUDE OPTICAL MODULATOR USING A TWO-ELECTRODE DFB LASER STRUCTURE

BACKGROUND OF THE INVENTION

1. Field of the Invention

The present invention relates to an amplitude optical modulator using a two-electrode DFB laser structure. It is used in optical telecommunications.

2. Discussion of the Background

The amplitude modulation of an optical beam is conventionally brought about by means of a birefringent crystal (e.g. of lithium niobate), to which is applied a modulated voltage. Such a procedure suffers from the disadvantage of introducing significant optical losses and of requiring the use of high voltages.

Another method consists of using a frequency-modulated laser source and then converting the frequency modulation, normally known as frequency shift keying (FSK) into amplitude modulation, normally called amplitude shift keying (ASK). This method is e.g. described in the article by D. MARCUSE, entitled "Computer Simulation of FSK Laser Spectra and of FSK-to-ASK Conversion" published in Journal of Lightwave Technology, vol.8, no.7, July 1990, pp.1110–1122.

However, in this method there is still a slight frequency modulation. This leads to a deformation of the optical signal during its propagation in the optical connecting fiber. Thus, it is known that the chromatic dispersion of a conventional optical fiber (type G 652), which is approximately 15 to 17 ps/km/nm, deforms the optical wave train and limits the information rate. Therefore this method suffers from disadvantages.

More recently other devices known as semiconductor amplifiers have appeared. They are more particularly described in the article by B. FERNIER, P. GARABEDIANE, E. DEROUIN and F. LEBLOND entitled "Chirp-Free 2.5 Gbit/s Amplitude Modulation/Gating in Two-Electrode Semiconductor Optical Amplifiers" published in Proceedings of ECOC 92. However, there is a rate limitation to such devices.

The present invention aims at obviating these disadvantages. To this end, it recommends the use of a per se known device, which is a two-electrode distributed feedback or DFB-type structure.

FIG. 1 gives brief details of this structure. It comprises a lower confinement layer 12, an active layer 14, an upper confinement layer 16, two electrodes 18, 18' and two current sources 20, 20'.

Such multi-electrode DFB structures are already known in the field of optical telecommunications, where they serve as a tunable optical filter when polarized below the threshold. This type of filter can be used as a photodetector or as a discriminator for frequency-modulated beams. Such a structure and such applications are described in the article by M. J. CHAWKI, R. AUFFRET, E. LE COQUIL, P. POTTIER, L. BERTHOU, H. PACIULLO and J. LE BIHAN entitled "Two-Electrode DFB Laser Filter Used as a Wide Tunable Narrow-Band FM Receiver: Tuning Analysis, Characteristics and Experimental FSK-WDM System", published in Lightwave Technol., vol.10, no.10, October 1992, pp. 1388–1397, as well as in the article by M. J. CHAWKI, R. AUFFRET, and L. BERTHOU entitled "1.5 Bbit/s FSK Transmission System Using Two-Electrode DFB Laser as Tunable FSK Discriminator/Photodetector", published in Electron. Lett., July 1990, vol.26, no.15, pp.1146–1147.

SUMMARY OF THE INVENTION

The present invention proposes another function for said device, which is amplitude modulation or amplitude shift keying. To this end, at least one of the two supply currents is intensity modulated just below the threshold ensuring the operation of the filter, which has the effect of bringing about a wavelength shift of the spontaneous emission peak. If the structure is designed in such a way that the wavelength of the beam passing through the active layer drops on one of the edges of the peak (leading or trailing edge), as a result of the shifting of the peak, the amplitude of the emergent beam will be modulated.

The amplitude shift keying obtained under these conditions has no effect on the incident beam frequency. Consequently there is no frequency change or chirp in the beam obtained.

Moreover, the passage through the active layer of the structure is not accompanied by an attenuation, as is the case with lithium niobate. In fact the beam can be amplified, as described by K. MAGARI, H. KAWAGUCHI, K. OE and M. FUKUDA in an article entitled "Optical Narrow-Band Filter Using Optical Amplification with Distributed Feedback", published in IEEE J. Quantum Electron, vol.24, no.11, November 1988, pp.2178–2190.

More specifically, the present invention relates to an amplitude optical modulator characterized in that it comprises a semiconductor structure of the distributed feedback laser type, two electrodes located on said structure, means for producing two currents and for applying them to the two electrodes in order to supply the structure below the laser oscillation threshold, the structure then having a spontaneous emission peak with a rising edge and a trailing edge and means for the intensity modulation of at least one of the two currents, said modulator being able to amplitude modulate an optical beam passing through it and having a wavelength dropping on one of the edges of the spontaneous emission peak.

BRIEF DESCRIPTION OF THE DRAWINGS

FIG. 9 Makes it possible to compare the optical signal at the output of the modulator with and without optical beam injection.

FIG. 10 Is a response curve of the modulator as a function of the frequency of the modulation with and without optical injection.

DESCRIPTION OF THE PREFERRED EMBODIMENTS

Figure 1:
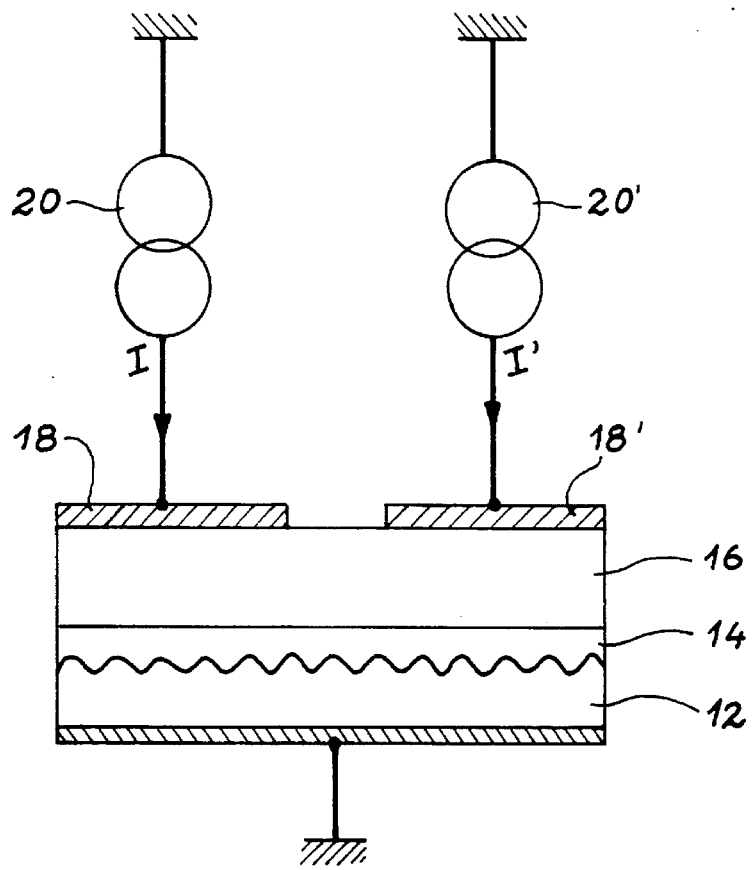
FIG. 1 Already described, diagrammatically shows a distributed feedback semiconductor structure with two electrodes.
Figure 2:
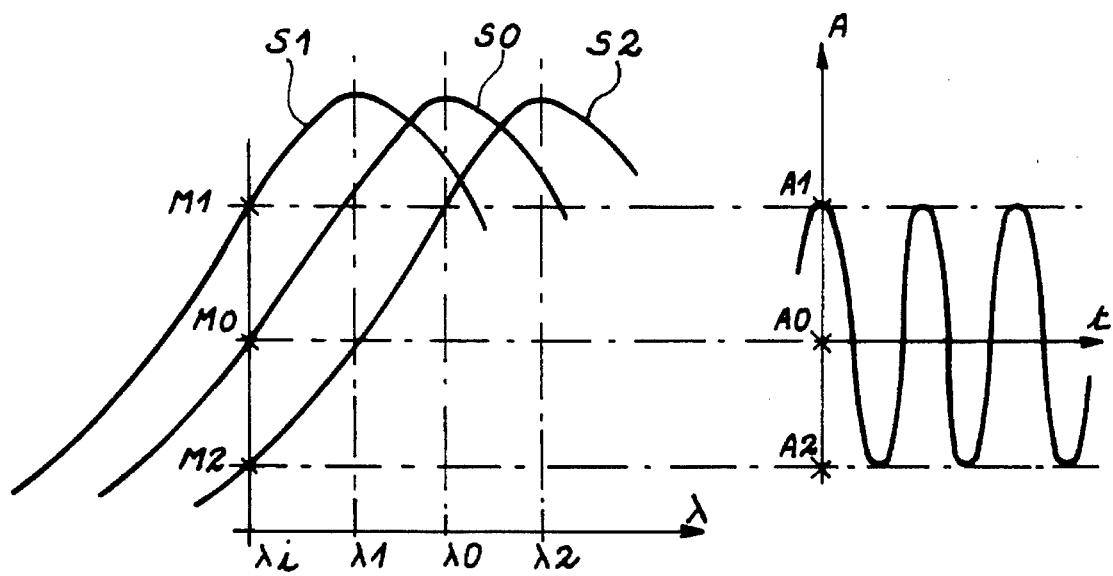
FIG. 2 Illustrates the operating principle of the modulator according to the invention.

FIG. 2 shows the spontaneous emission peaks $S_0$, $S_1$ and $S_2$, characteristic of a two-electrode DFB structure supplied below the threshold. The wavelength is plotted on the abscissa and the intensity on the ordinate, all in arbitrary units.

The peak $S_0$ is obtained for a certain current injected into the structure through the two electrodes. It culminates at a wavelength $\lambda_0$. If the intensity of one of the currents is modified, there is a wavelength shift of the peak, e.g. towards $S_1$ and it culminates at $\lambda_1$. If the same intensity is modified in the other direction, the peak is shifted towards $S_2$ and culminates at $\lambda_2$.

Consideration is then given to an incident optical beam, whose wavelength $\lambda_i$ e.g. drops onto the rising edge of the peak. When this beam passes through the structure, its amplitude is modified during the shifting of the peak. When the peak is shifted from $S_1$ to $S_2$ and then from $S_2$ to $S_1$, the point is shifted between $M_1$ and $M_2$ and the amplitude of the emergent beam oscillates between a high amplitude $A_1$ (corresponding to the peak $S_1$) and a low amplitude $A_2$ (corresponding to the peak $S_2$). However, the wavelength of the beam remains equal to $\lambda_1$.

Thus, a modulation of one of the currents produces an amplitude shift keying of the optical beam which has traversed the structure.

Naturally, this operating mode applies both to the rising edge and to the trailing edge beyond the apex of the peak. The only difference is a phase change of the modulation of 180°. The only important point is therefore that the operating point remains on one of the edges, in words, that the wavelength $\lambda_i$ of the incident beam is always slightly below the smallest wavelength $\lambda_1$ of the peak or always slightly above the highest wavelength $\lambda_2$.

Figure 3:
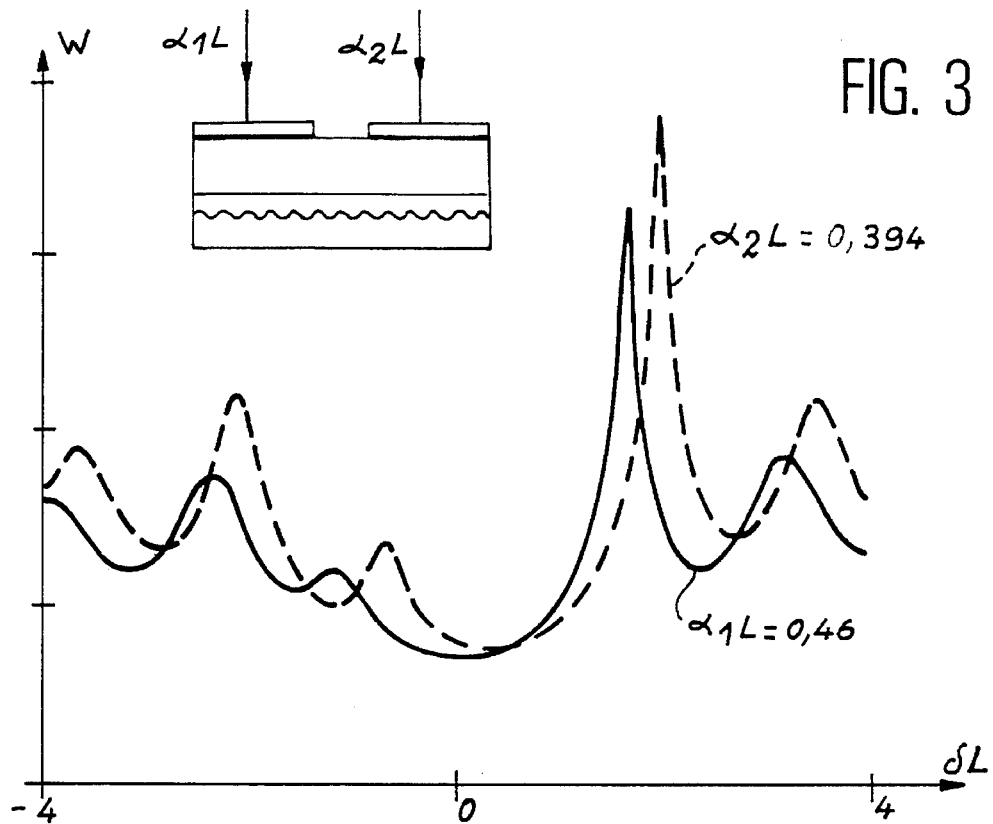
FIG. 3 Shows the shifting of the theoretical spontaneous emission spectrum of a two-electrode DFB laser for a fixed current and a variable current.

FIG. 3 shows two theoretical spectra obtained with a two-electrode DFB structure operating below the threshold. The calculation of the theoretical spectrum is based on a method developed by T. MAKINO in the article entitled "Transfer Matrix Analysis of Amplified Spontaneous Emission of DFB Semiconductor Laser Amplifiers", published in IEEE, J. Quantum Electron., vol.24, pp.1507–1518, August 1988.

The two spectra correspond to the same current injected into the first electrode 18 and a current assuming two different values in the second electrode 18'. On the abscissa is plotted the quantity $\partial L$ and on the ordinate the optical power of the laser W, $\partial$ being the BRAGG deviation defined by $\partial = \beta - \beta_0$ or $\beta_0 = \pi / \wedge$ in which $\wedge$ is the spacing of the grid. L is the length of the electrode in question. The currents are referenced by a quantity $\alpha L$, in which $\alpha$ represents the gain of the active zone located below the electrode, the gain being directly linked with injected current. In FIG. 3 the two curves both correspond to $\alpha_1 L=0.34$ and respectively to $\alpha L=0.46$ for one and $\alpha L=0.394$ for the other.

Figure 4:
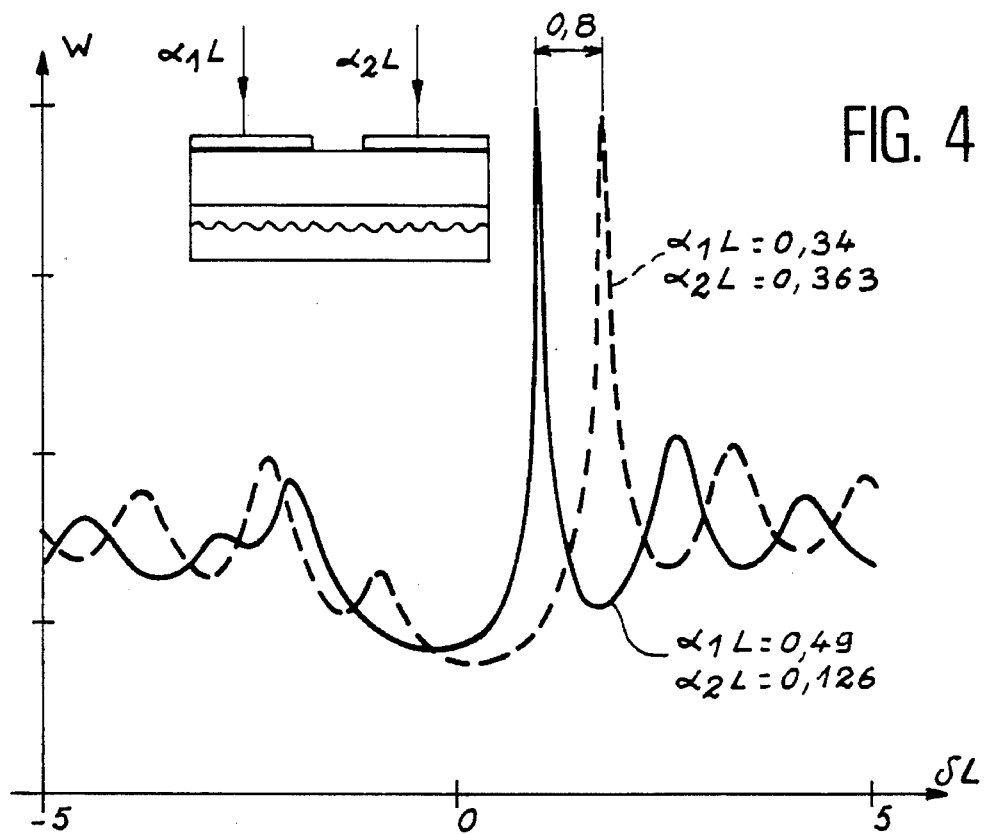
FIG. 4 Illustrates a theoretical maximum shifting range for a DFB laser as a function of the injected currents.

FIG. 4 shows the maximum variation obtainable with the structure used. The two extreme curves correspond to $\alpha_1 L=0.49$ and $\alpha_2 L=0.126$ on the one hand (left-hand peak) and $\alpha_1 L=0.34$ and $\alpha_2 L=0.363$ on the other (right-hand peak). The total variation between the two peaks is $\Delta_1 L=0.8$.

Figure 5:
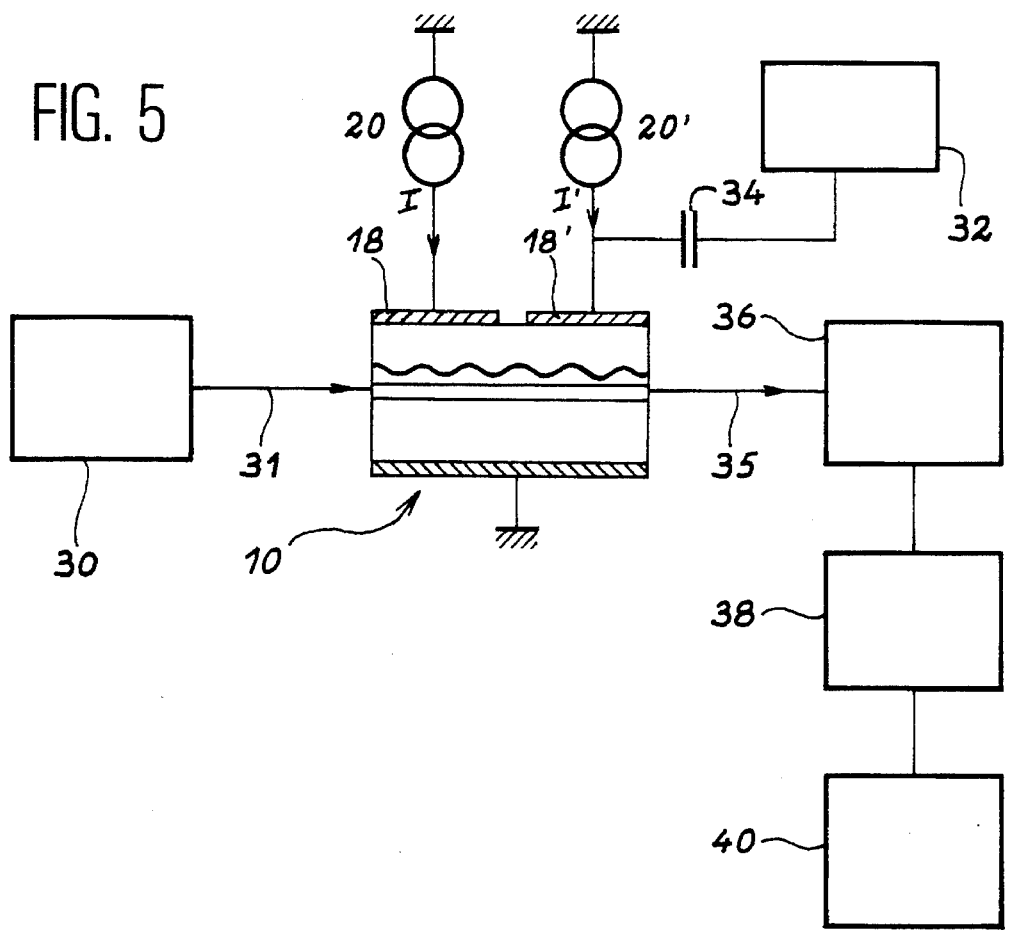
FIG. 5 Illustrates an equipment making it possible to measure the amplitude shift keying.

FIG. 5 shows an equipment making it possible to measure the characteristics of the amplitude shift keying obtained according to the invention. The two-electrode DFB structure carries the reference 10. It receives from a laser source 30 an incident beam 31 having a wavelength $\lambda_i$. The currents I and I' supply the two electrodes 18, 18' and are regulated in such a way that the wavelength $\lambda_i$ drops on one of the edges of the spontaneous emission peak of the structure. The latter also comprises a sine-wave current generator 32, which modulates the current I' across a capacitor 34. The optical beam 35 emerging from the structure 10 is detected by a detector 36, which is connected to an amplifier 38, e.g. of 55 dB, which is finally connected to a spectrum analyzer or oscilloscope 40.

Figure 6:
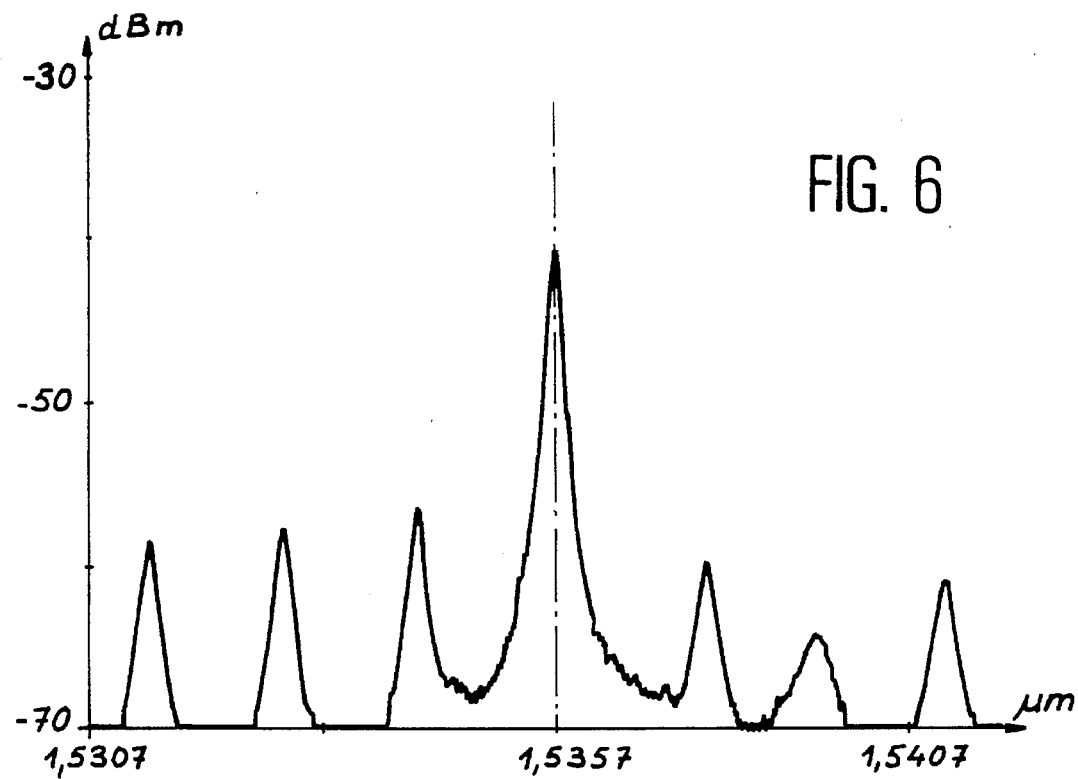
FIG. 6 Shows a real spontaneous emission spectrum of a two-electrode DFB laser.
Figure 7:
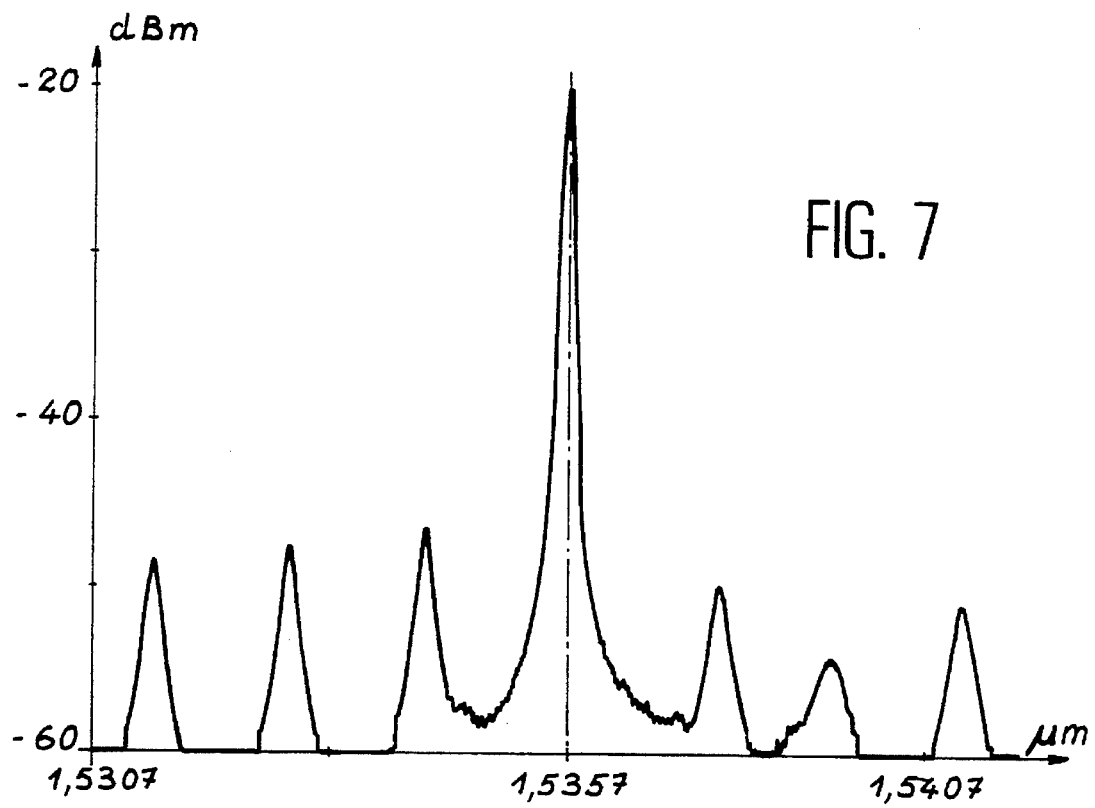
FIG. 7 Shows the real spontaneous emission spectrum of the two-electrode DFB laser subject to an optical injection.

FIGS. 6 and 7 show the real spontaneous emission spectrum of the two-electrode DFB laser without and with an optical injection. The wavelength in micrometers is plotted on the abscissa and the intensity in dBm on the ordinate.

Figure 8:
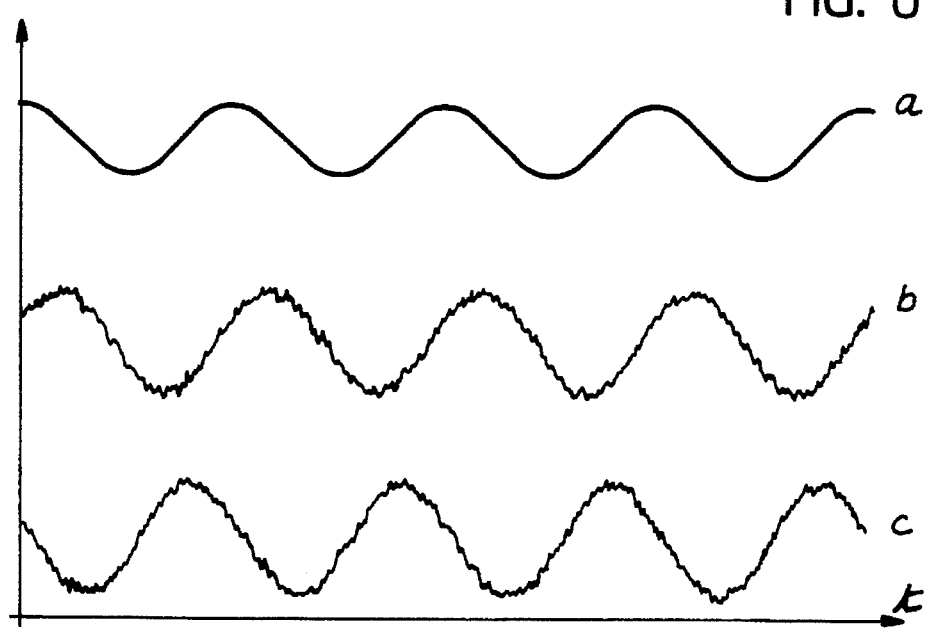
FIG. 8 Shows the amplitude shift keying obtained along the edge used of the spontaneous emission peak.

With the installation of FIG. 5 it is possible to plot curves like those of FIGS. 8 to 10.

FIG. 8 shows on line (a), the sine-wave modulation current. In the experiment illustrated, the peak-to-peak amplitude of said current was 2.52 mA, whilst the constant current I was 8.2 mA.

Lines (b) and (c) show the amplitude shift keying obtained on the optical output beam 35. The input beam 31 had a power of 200 µW and its wavelength $\lambda_i$ was 1535.295 nm. In order to place this wavelength on the rising edge of the spontaneous emission peak, a current of 4.1 mA was injected onto the electrode 18' (line (b)) and for placing it on the trailing edge a current of 4.3 mA (line (c)). Thus, on these currents was superimposed the 2.52 mA modulation current represented by line (a).

It is clear that the two amplitude shift keyings are in phase opposition, which is not surprising because they correspond to two edges of opposite gradients of the spontaneous emission peak. Therefore, in the represented case, the modulation amplitude is 14 dBm.

In order to prove that the amplitude shift keying obtained is indeed due to the phenomenon described and not to a modulation resulting from the spontaneous light of the structure, measurements like those of FIG. 9 were performed. Line (a) still shows a sine-wave modulation current and line (b) the amplitude shift keyed output optical signal. The incident optical power was 500 µW at 1535.295 nm. The current I injected on the electrode 18 was 8.2 mA and the current I' on the electrode 18' 4.3 mA. The line (c) shows the spontaneous light intensity passing out of the modulator when the input beam is eliminated. Clearly it is not affected by any amplitude shift keying. Thus, all the modulation observed on line (b) corresponds to the optical beam which has passed through the modulator.

Finally, FIG. 10 shows the response curve of the modulator as a function of the frequency, which is plotted on the abscissa and ranges between 1 MHz and 2.5 GHz. The power injected into the modulator was still 500 µW and the wavelength 1535.295 nm. The currents I and I' were respectively 7.7 mA and 4.5 mA, the latter current being modulated to obtain an amplitude shift keying of 14 dBm. Line (a) shows the frequency response of the modulator with the injected optical beam and the line (b) said same response without the injected optical beam. The response is flat up to 2.5 GHz. The applicant observed that the response remained flat up to at least 3.6 GHz.

We claim:

1. An amplitude optical modulator comprising:

a laser source for generating an input laser beam;

a distributed feedback laser semiconductor structure having a laser oscillation threshold for receiving the input laser beam;

two electrodes formed on the distributed feedback laser;

two current sources for supplying currents respectively to the two electrodes, the two currents being below the laser oscillation threshold, the distributed feedback laser having a spontaneous emission peak with a rising edge and a trailing edge;

means for intensity modulating at least one of the two currents so that a wavelength of the input laser beam coincides with one of the rising edge or tailing edge of the spontaneous emission peak, to thereby amplitude modulate the input laser beam.

2. The optical modulator according to claim 1, wherein the intensity modulating means comprises a sine-wave generator.

3. The optical modulator according to claim 2, wherein the intensity modulating means further comprises a capacitor connected to an output of the sine-wave generator.

4. A method for amplitude modulating an optical signal comprising the steps of:

generating an input laser beam;

inputting the input laser beam into a distributed feedback laser semiconductor structure having a laser oscillation threshold and in which two electrodes are formed on the distributed feedback laser;

supplying currents respectively to the two electrodes, the two currents being below the laser oscillation threshold, the distributed feedback laser having a spontaneous emission peak with a rising edge and a trailing edge;

intensity modulating at least one of the two currents so that a wavelength of the input laser beam coincides with one of the rising edge or tailing edge of the spontaneous emission peak, to thereby amplitude modulate the input laser beam.

5. The method for amplitude modulating an optical signal according to claim 4, wherein the step of intensity modulating includes generating a sine-wave.

6. The method for amplitude modulating an optical signal according to claim 5, wherein the step of intensity modulating further includes passing the sine-wave through a capacitor.

* * * * *

UNITED STATES PATENT AND TRADEMARK OFFICE
CERTIFICATE OF CORRECTION

PATENT NO. : 5,493,438
DATED : Feb. 20, 1996
INVENTOR(S) : Emmanuel Gay et al.

It is certified that error appears in the above-indentified patent and that said Letters Patent is hereby corrected as shown below:

```
On the title page, should read

--[75]   Inventors:   Emmanuel Gay, Perros Guirec;
                          Mouhamad Chawki, Lannion; Marc
                          Le Ligne, Pleumeur-Bodou, all
                          of France--
```

Signed and Sealed this

Twenty-eighth Day of May, 1996

Attest:

BRUCE LEHMAN

*Attesting Officer*  *Commissioner of Patents and Trademarks*